United States Patent [19]

Wenger et al.

[11] Patent Number: 5,232,904
[45] Date of Patent: Aug. 3, 1993

[54] MATERIALS HAVING A ZERO RESISTANCE TRANSITION TEMPERATURE ABOVE 200 K AND METHOD FOR MAINTAINING THE ZERO RESISTANCE PROPERTY

[75] Inventors: Lowell E. Wenger, Troy; Juei-Teng Chen, Sterling Heights; Eleftherios M. Logothetis, Birmingham, all of Mich.

[73] Assignee: Ford Motor Company, Dearborn, Mich.

[21] Appl. No.: 704,913

[22] Filed: May 21, 1991

Related U.S. Application Data

[63] Continuation of Ser. No. 382,452, Jul. 19, 1989, abandoned.

[51] Int. Cl.$^5$ .................. C01F 11/02; C01F 17/00; C01G 3/02
[52] U.S. Cl. .................. 505/1; 423/604; 505/725; 505/742; 505/780
[58] Field of Search .................. 505/1, 725, 742; 252/518, 521; 423/604

[56] References Cited

FOREIGN PATENT DOCUMENTS 0301646 2/1989 European Pat. Off. .................. 505/1

OTHER PUBLICATIONS

Chiang et al. "Low Temp. Thermal Properties of $Ba_2YCu_3O_x$ . . . " *Adv. Cer. Mat'ls* vol. 2 No. 3B Jul. 1987, pp. 530–538.

Lin "Superconductivity and Structure of Single Crystal . . . " *Physics Letter A* May 4, 1987 pp. 305–306.

Weber "Processing Relationships in $YBa_2(C_3O_x$ Superconductors" *Mat. Res. Soc. Symp. Proc.* vol. 99 Nov. Dec. 1987, pp. 627–630.

Itoh "Preparation of Superconducting Y-Ba-Cu-O Thick Film" *Jap. Jul. Appl. Phys.* vol. 27(3) Mar. 1988 pp. L420–L422.

Blendell "Relationships of Electrical, Magnetic and Mechanical . . . " *Chemistry of High-Tc Super* 1987 pp. 240–260.

McCallum "Problems in the Production of $YBa_2Cu_3O_x$ . . . " *Adv. Cer. Mat'l* vol. 2 (3B) Jul. 1987 pp. 388–400.

Dijkkamp "Preparation of Y-Bu-Cu-Oxide Superconductor . . . " *Appl. Phys. Lett.* vol. 51(8) Aug. 24, 1987 pp. 619–621.

Jin "High-Tc Superconductors-Composite Wire Fabrication" Appl. Phys. Lett. vol. 51(3) Jul. 20, 1987, pp. 203–204.

Swaminathan "Thermal Stability of Superconducting $YBa_2Cu_3O_x$ . . . " *Materials Letters* vol. 6 (8,9) May 1988 pp. 261–264.

J. T. Chen, L. E. Wenger, C. J. McEwan, and E. M. Logothetis, "Observation of the Reverse ac Josephson Effect in YBaCuO at 240 K", Physical Review Letters, vol. 58, No. 19, pp. 1972–1975, 11 May 1987.

C. Y. Huang, L. J. Dries, P. H. Hor, R. L. Meng, C. W. Chu, and R. B. Frankel, "Observation of Possible Superconductivity at 230 K", Nature, vol. 328, pp. 403–404, 30 Jul. 1987.

H. Ihara, N. Terada, M. Jo, M. Hirabayashi, M. Tokumoto, Y. Kimura, T. Matsubara, and R. Sugise, "Possibility of Superconductivity at 65° C. in SnBaY-CuO System", Japanese Journal of Applied Physics, vol. 26, pp. L1413–L1415 1987.

(List continued on next page.)

Primary Examiner—Paul Lieberman
Assistant Examiner—John Boyd
Attorney, Agent, or Firm—Lorraine S. Melotik; Roger L. May

[57] ABSTRACT

This invention is directed to a method for making multiphase copper oxide based materials which have a phase having a zero resistance transition temperature above about 200K. The method comprises subjecting a copper oxide based material precursor to an oxygenation in an atmosphere comprising more than about 20% oxygen by volume at a temperature less than about 200° C. for a time sufficient to form the material. The invention also is directed to maintaining the properties of a copper oxide based material having a zero resistance transition temperature above 150K.

8 Claims, 1 Drawing Sheet

OTHER PUBLICATIONS

J. Narayan, V. N. Shukla, S. J. Lukasiewicz, N. Biunno, R. Singh, A. F. Schreiner, and, S. J. Pennycook, "Microstructure and Properties of $Y_1Ba_2Cu_3O_9\delta$ Superconductors with Transitions at 90 and 290 K", Applied Physics Letters, vol. 51, No. 12, pp. 940–942, 21 Sep. 1987.

H. D. Jostarndt, M. Galffy, A. Frecmuth, and D. Wohlleben, "Unstable High Temperature Superconductivity and Martensitic Effects in YBaCuO", Solid State Communications, vol. 69, No. 9, pp. 911–913, Mar. 1989.

D. N. Matthews, A. Bailey, R. A. Vaile, G. J. Russell, and K. N. R. Taylor, "Increased Transition Temperature in $Y_1Ba_2Cu_3O_y$ Superconducting Ceramics by Exposure to Nitrogen", Nature, vol. 328, pp. 786–787, 27 Aug. 1987.

K. N. R. Taylor, A. Bailey, D. N. Matthews, and G. J. Russell, "Enchancement of Tc in $Y_1Ba_2Cu_3O_{7-\delta}$ Superconductors by Gas Absorption", Physica C, vol. 153–155, pp. 349–350, 1988.

D. N. Matthews, A. Bailey, T. Puzzer, G. S. Russell, J. Cochrane, R. A. Vaile, H. B. Sun, and K. N. R. Taylor, "Effects of Helium Absorption on the Superconducting Mechanism of $Y_1Ba_2Cu_3O_y$", Solid State Communications, vol. 65, No. 5, pp. 347–350, Feb. 1988.

X. Granados, M. Carrera, J. Fontcuberta, M. Vallet, and J. M. Gonzalez-Calbet, "On the Effects of Helium Absorption on the Superconducting Onset of $Y_1Ba_2Cu_3O_{7-y}$", Solid State Communications, vol. 69, No. 11, pp. 1073–1077, Mar. 1989.

MATERIALS HAVING A ZERO RESISTANCE TRANSITION TEMPERATURE ABOVE 200 K AND METHOD FOR MAINTAINING THE ZERO RESISTANCE PROPERTY

This is a continuation of copending application Ser. No. 07/382,452, filed on Jul. 19, 1989, now abandoned.

This invention relates to a method for making multiphase copper oxide based materials having a zero resistance transition temperature ($T_c$) above about 200K. This invention further relates to a method for maintaining the zero resistance property of these copper oxide based materials having a $T_c$ above about 150K.

BACKGROUND OF THE INVENTION

The recent discovery of superconducting metal oxides such as $YBa_2Cu_3O_{7-y}$ (with $y<0.5$) having superconducting transition temperatures at least 10 to 20K above the temperature of liquid nitrogen (77K) has created a great deal of excitement. As known in the art, the superconducting transition temperature ($T_{sc}$) of a material is that temperature below which the material has essentially zero electrical resistance. Heretofore known superconducting materials have much lower $T_{sc}$'s. These superconducting metal oxides have vast potential for use in diverse applications in a large number of electrical and electronic devices which can operate at these higher temperatures.

Generally, in making such superconducting materials in the $Y_1Ba_2Cu_3O_{7-\delta}$ system, a metal oxide precursor material is first formed and then subjected to an anneal in oxygen to make it superconducting. The typical annealing schedule consists of a relatively slow heating to a peak temperature in the range of 850° to 950° C., annealing in oxygen at this temperature for a time period ranging from a few minutes to several days, followed by a slow cooling at a rate of 1 to 3 degrees per minute in $O_2$. It is believed that oxygen atoms diffuse into the lattice structure when the material cools down through the temperature range of about 600°-450° C. These materials, having transition temperatures around 90K, are stable at room temperature in air and retain their superconducting properties (transition temperatures around 90K) even through repeated thermal cycling between 4K and 300K. This is believed due to the fact that the oxygen is "locked" in the crystal lattice.

A great deal of effort has been expended in the last 24 months to make superconducting materials having even higher transition temperatures than those described above. Currently, the highest superconducting transition temperature for well established CuO-based materials is 125K in the TlBaCaCuO system, although evidence for superconductivity/zero resistance at temperatures above this temperature in CuO-based materials has been reported in numerous publications and communications since February 1987, including the following papers: J. T. Chen, L. E. Wenger, C. J. McEwan, and E. M. Logothetis, "Observation of the reverse ac Josephson effect in YBaCuO at 240K", Physical Review Letters, Vol. 58, No. 19, pp. 1972-1975, 11 May 1987; C. Y. Huang, L. J. Dries, P. H. Hor, R. L. Meng, C. W. Chu, and R. B. Frankel, "Observation of possible superconductivity at 230K", Nature, Vol. 328, pp. 403-404, 30 July 1987; H. Ihara, N. Terada, M. Jo, M. Hirabayashi, M. Tokumoto, Y. Kimura, T. Matsubara, and R. Sugise, "Possibility of superconductivity at 65° C. in SrBaYCuO system", Japanese Journal of Applied Physics, Vol. 26, pp. L1413-L415, 1987; J. Narayan, V. N. Shukla, S. J. Lukasiewicz, N. Biunno, R. Singh, A. F. Schreiner, and S. J. Pennycook, "Microstructure and properties of $Y_1Ba_2Cu_3O_{9-\delta}$ superconductors with transitions at 90 and 290K", Applied Physics Letters, Vol. 51, No. 12, pp. 940-942, 21 September 1987; and H. D. Jostarndt, M. Galffy, A. Freimuth, and D. Wohlleben, "Unstable high temperature superconductivity and martensitic effects in YBaCuO", Solid State Communications, Vol. 69, No. 9, pp. 911-913, March 1989. These papers teach that although previous materials showing higher transition temperatures (greater than 90K) were prepared by conventional ceramic techniques, the materials all suffer from the lack of stability and reproducibility. That is, the zero-resistance state (the ability to pass current without any voltage drop or power loss) in these CuO-based superconducting materials at these higher transition temperatures is a temporary (usually one time) phenomenon which may exist for only a few thermal cyclings of the sample through its higher transition temperature, even though the lower 90K superconducting transition remains.

In addition, several papers report that exposure of certain CuO-based superconductors to a gas during electrical measurements at cryogenic temperatures (77K to 150K) can enhance their 90K superconducting transition temperature. These papers include: D. N. Matthews, A. Bailey, R. A. Vaile, G. J. Russell, and K. N. R. Taylor, "Increased transition temperature in $Y_1Ba_2Cu_3O_y$ superconducting ceramics by exposure to nitrogen", Nature, Vol. 328, pp. 786-787, 27 August 1987; K. N. R. Taylor, A. Bailey, D. N. Matthews, and G. J. Russell, "Enhancement of $T_c$ in $Y_1Ba_2Cu_3O_{7-\delta}$ superconductors by gas absorption", Physica C, Vol. 153-155, pp. 349-350, 1988; D. N. Matthews, A. Bailey, T. Puzzer, G. J. Russell, J. Cochrane, R. A. Vaile, H. B. Sun, and K. N. R. Taylor, "Effects of helium absorption on the superconducting mechanism of $Y_1Ba_2Cu_3O_y$", Solid State Communications, Vol. 65, No. 5, pp. 347-350, February 1988; and X. Granados, M. Carrera, J. Fontcuberta, M. Vallet, and J. M. Gonzalez-Calbet, "On the effects of helium absorption on the superconducting onset of $Y_1Ba_2Cu_3O_{7-y}$", Solid State Communications, Vol. 69, No. 11, pp. 1073-1077, March 1989. The cited reference in Physica C teaches that the superconducting transition temperature for a single-phase $Y_1Ba_2Cu_3O_7$ superconductor material can be enhanced to a maximum of 105K when exposed to $O_2$ gas for a few hours at 77K, although the zero resistance still occurs at 90K.

Extensive research has been carried out in an attempt to provide a "stable", higher transition temperature superconducting phase material because of its potential for applications in the electronic/electrical industries. It is an object of the present invention to provide a method for making a material that exhibits zero resistance and for maintaining its zero resistance property. It is a further object of this invention to provide a method for maintaining the zero resistance property of still other copper oxide based materials.

BRIEF DESCRIPTION OF THE INVENTION

We have successfully developed a process for making a CuO-based material (e.g., Y-Ba-Cu-O) having a zero-resistance state above the temperature of dry ice (195K) which state can be maintained substantially stable, even through repeated thermal cycling. According to one aspect of the invention, it is directed to a process for making a multiphase copper oxide based material having a zero resistance transition temperature above about 200K. The materials may be of a single structural phase or a mixed-structural-phase and may exhibit a lower superconducting transition temperature, e.g., a 90K superconducting phase. The method comprises: forming a copper oxide based material precursor consisting essentially of R, A, Cu, and O, where R is selected from the group of elements consisting of rare earth elements and yttrium and A is selected from essentially of divalent metals, preferably being Ba, Sr, and Ca, which precursor can be oxygenated to yield the multiphase copper oxide based material; and subjecting the precursor to a low temperature oxygenation process in an atmosphere comprising at least about 20% oxygen by volume at a temperature less than about 200° C., preferably between about $-100°$ C. and 200C, for at least 72 hours to form the multiphase copper oxide based material. The invention in another aspect is directed to the multiphase copper oxide based material made by the novel method disclosed above.

According to yet another aspect of this invention, it is directed to a method for maintaining the zero resistance property of the copper oxide based materials having a zero resistance transition temperature above about 150K, such as those made by the method disclosed above. The method comprises: essentially maintaining the oxygen content of the copper oxide based materials (having $T_c$'s $>$ 150K). The maintaining step may comprise (i) enveloping or surrounding said copper oxide materials with a coating substantially non-permeable to oxygen, or (ii) providing an oxygen atmosphere comprising at least 50% by volume oxygen surrounding the copper oxide based material while keeping the copper oxide based material at a temperature less than about 200° C.

DETAILED DESCRIPTION OF THE INVENTION

Figure 1:
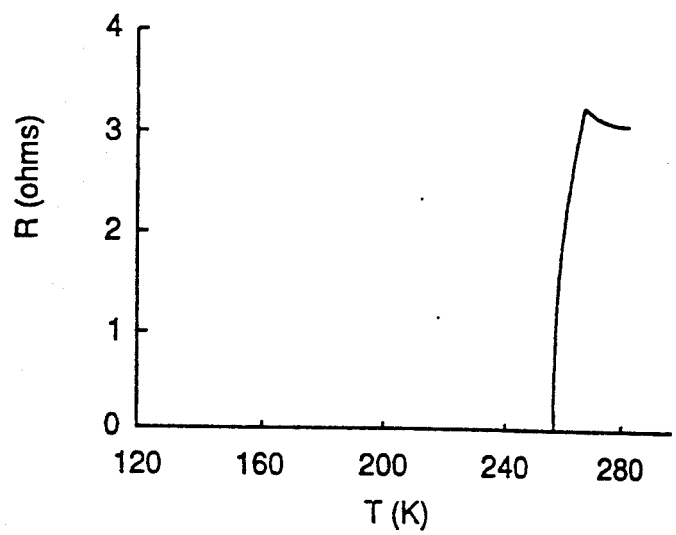
FIG. 1 is a graph which shows the temperature dependence of the resistance for a nominal $Y_5Ba_6Cu_{11}O_y$ material made according to the invention.

This invention, according to one aspect, is directed to a method of making a copper oxide based material exhibiting essentially zero electrical resistance above about 200K. This as well as the other aspects of the invention disclosed above will be hereinafter discussed in greater detail.

The method comprises forming a copper oxide based material precursor, which precursor can be oxygenated (as described herein) to yield the copper oxide based material. The precursor may be in bulk, ceramic, single crystal or thin film form. The copper oxide material precursor according to the invention disclosed herein consists essentially of R, A, Cu and O. R is selected from the group of elements consisting essentially of rare earth elements and yttrium. The rare earth elements are well known to those skilled in the art and include such elements as europium and neodymium. A is selected from the group of elements consisting essentially of divalent metals, preferably alkaline earth elements, more preferably being selected from Ba, Sr, and Ca and compatible mixtures thereof. The atomic ratio of R:A:Cu in the precursor may vary widely. It may be, e.g., the 1:2:3 of prior art superconducting materials, or any other ratio which will provide a precursor material which may be made superconducting according to the present invention, i.e., having a $T_c > 200K$. Exemplary of such materials are $Y_5Ba_6Cu_{11}O_y$, $Y_{1.8}Ba_{0.2}CuO_x$, $Y_1Ba_2Cu_3O_x$, $YBaSrCu_3O_x$, and $EuBa_2Cu_3O_x$. Still other suitable precursor materials which may be suitably used in the invention will be apparent to those skilled in the art in view of the present disclosure. As disclosed above, the precursor is a R-A-Cu-O material which can be oxygenated according to the low temperature oxygenation process of the invention to form a material having a $T_c > 200K$. This precursor may be a single structural-phase material which can be oxygenated to provide a $>200K$ material or a multi-structural-phase material having a phase which can be oxygenated to provide a $>200K$ material. The multi-phase material may exhibit a low $T_c$, such as the 90K phase of priorly discussed materials.

The precursor, prior to being subjected to the oxygenation step, may be in bulk form. Bulk precursor samples may be prepared by any suitable technique, including conventional ceramic forming techniques which are well known in the art. According to conventional ceramic techniques, a precursor sample could be prepared by mixing appropriate starting materials (e.g., oxides, carbonates, hydroxides) in a ball mill. It may be desirable to subsequently press the mixture into a pellet at high pressures, e.g., 5000–15,000 psi, and then sintered the pellet under flowing oxygen at elevated temperatures, e.g., between 800°–1000° C. Alternately, according to conventional techniques, samples may be formed by first reacting the appropriate starting material powders at elevated temperatures under flowing oxygen, then regrinding the product to make a powder, and subsequently pressing the powder into pellets for final firing to form the precursor.

For example, embodiments of the present invention precursor bulk materials such as $Y_1Ba_2Cu_3O_x$, $Y_1Ba_2Cu_4O_2$, and $Y_5Ba_6Cu_{11}O_y$ were synthesized from $Y_2O_3$, $BaCO_3$, and CuO powders. The unreacted powders were calcined at about 925° C. for 10 hours until becoming black, then ground into a powder and pressed into a pellet at about 50,000 psi. The pellet was sintered at 900° C. for 24 hours in flowing $O_2$ and then reground. After pressing into another pellet, this pellet was sintered in $O_2$ at 925° C. for another 24 hours to form the precursor. This invention is not meant to be limited, however, to such techniques or starting materials for the precursor according to this invention. Still other techniques and materials for forming bulk precursor materials according to this invention will be apparent to those skilled in the art in view of the present disclosure.

The precursor, prior to being subjected to the oxygenation step, may also be a film which has been applied to a substrate. The film may be deposited on any suitable substrate, that is one which will accept a film of the precursor and which can be subsequently oxygenated in an oxygen atmosphere according to this invention. Exemplary of substrates which can be herein employed for the method of the invention are $SrTiO_3$, $LaAlO_3$, $LaGdO_3$, $ZrO_2$, MgO, $Al_2O_3$, Si and $SiO_2$. The substrate may be of any type of such material and in any desired shape. If the film/substrate is intended for use in electronic devices, however, the substrate would probably be in the form of a wafer as is commonly used in the electronics industry.

The precursor film may be deposited on the substrate by any suitable deposition technique, many of which are well known in the art. The film may be deposited by physical deposition techniques including electron beam evaporation, sputtering, molecular beam epitaxy, ion beam deposition, laser deposition and by chemical deposition techniques, e.g., metalorganic deposition. According to such physical deposition techniques, the superconducting precursor may be deposited from a target or targets in a gas atmosphere or in a vacuum wherein the target comprises one of the component materials of the film or a composite of the components of the film. The targets may be in powder or compacted form. If the target comprises a composite of the components of the film, they may be reacted or unreacted. The precursor film may be deposited by techniques including electron beam evaporation employing sources of Cu metal, Y metal, and pressed $BaF_2$ with a subsequent 800°-900° C. oxygen anneal/calcination treatment to form the precursor film. As would be apparent to those skilled in the art in view of the present disclosure, other materials such as $BaO_2$, $CuO_2$, BaO, acetates of R, Ba, Cu, etc, may be used in making the film. Still other suitable materials and techniques for making a precursor film will be apparent to those skilled in the art in view of the present disclosure.

As discussed above, we have found that if we subject the precursor to a unique low temperature oxygenation process, the precursor converts, after oxygenation, to a material having a zero resistance transition temperature above about 200K, which $T_c$ may be essentially maintained through repeated thermal cycling. This oxygenation process comprises subjecting the precursor (i) to an atmosphere comprising more than about 20% oxygen by volume, (ii) at a temperature less than about 200° C., preferably between about $-100°$ C. and 200C, most preferably between about 25° C. and about 200° C., (iii) for a time sufficient to form the copper oxide based material. The oxygen atmosphere preferably comprises greater than 50% by volume oxygen, more preferably greater than 95% by volume oxygen. The remaining gases, if any, present in the oxygen atmosphere may be any gas or a mixture of gases which do not interfere with the oxygenation process. Such gas can include inert gases like nitrogen and argon. The oxygen atmosphere is preferably at least one atmosphere of pressure, more preferably at a pressure of greater than 100 atmospheres. For example, according to certain embodiments of the invention, oxygenation was carried out at a temperature between about 50°-70° C. in an atmosphere comprising more than about 95% oxygen for greater than about 5 days. According to other embodiments of the invention, oxygenation was carried out at a temperature between about 120°-170° C. in the oxygen atmosphere of 130 atmospheres for at least about 72 hours. The optimal oxygenation processing conditions, e.g., the oxygenation time, the composition of the oxygen atmosphere, the temperature and pressure conditions, would be dependent on the particular composition of the precursor, its porosity, the thickness of the precursor, etc., as will be apparent to one skilled in the art in view of the present disclosure. The oxygenated material may be cooled to room temperature if desired. If this is done, however, an oxygen environment preferably greater than 50% by volume, more preferably greater than 95% oxygen by volume, must be maintained surrounding the material.

According to another aspect of the invention, it is directed to a method for maintaining the zero resistance property of copper oxide based materials which have a zero resistance transition temperature above about 150K. We have found that to maintain the zero resistance property of the material it is necessary to essentially maintain the oxygen content of the $>150K$ material. Exemplary of one material which would benefit from this aspect of the invention is the material made according to the method disclosed previously herein. This method of maintaining zero resistance property is not, however, limited to that material. It is also found beneficial to be used to maintain the zero resistance property of materials made by other methods.

The oxygen content of the materials described above may be maintained in any of several different ways. For example, the oxygen content of the material may be maintained by enveloping or surrounding it with a coating substantially non-permeable to oxygen. Such a coating may be a gas impervious ceramic oxide like aluminum oxide. Another way to essentially maintain the oxygen content of the material, and hence its properties, is to surround it with an oxygen environment which precludes a loss in the overall oxygen content of the material. This may comprise (i) providing an oxygen atmosphere comprising at least 50% by volume oxygen surrounding the copper oxide based material (essentially at all times), and (ii) keeping the temperature of the material at less than about 200° C. Under such conditions, even if some oxygen is diffusing out of the material, at the same time oxygen is being absorbed into the material, so that an equilibrium is established which maintains the overall oxygen content of the material. The pressure of the oxygen atmosphere may be varied so as to maintain this equilibrium. Preferably, the oxygen atmosphere comprises at least 95% by volume oxygen, and the temperature of the material is preferably less than about 100° C. when the oxygen pressure is about one atmosphere. If the temperature is higher than 100° C., preferably the oxygen pressure is greater than about one atmosphere, preferably greater than about 10 atmospheres. Selection of optimal conditions of pressure, temperature and amount of oxygen in the atmosphere will be apparent to those skilled in the art in view of the present disclosure. It has been found, that in order to maintain the zero resistance property of the materials, e.g., even when making measurements of the electrical resistivity of the material, it is necessary to maintain the oxygen content of the material which may be done by keeping the material in an oxygen environment.

The invention will be further understood by referring to the following detailed examples. It should be understood that the subject examples are presented by way of illustration and not by way of limitation.

EXAMPLE 1

A copper oxide based material was made according to an embodiment of this invention in this example. The precursor had a nominal composition of $Y_5Ba_6Cu_{11}O_y$ and was synthesized by conventional ceramic techniques from $Y_2O_3$, $BaCO_3$, and CuO powders as follows. The unreacted powders were calcined at 925° C. ($\pm 25°$ C.) for 10 hours in air. This calcination step followed by subsequent grindings of the powder was repeated until a material with dark black color and a fine crystallite texture was obtained. The reacted black powder is then pressed into a ¾ inch disk-shaped pellet at approximately 50,000 psi. The pellet was sintered at 900° C. for 24 hours in flowing $O_2$, cooled to room temperature over a period of 6 hours, and then reground. This powder was then heated to 925° for 24 hours in air, cooled to room temperature over a period of 6 hours, and reground. After pressing into another pellet, this pellet was sintered again in $O_2$ at 900° C. for another 24 hours and then cooled to room temperature over a six hour period. The x-ray diffraction patterns of the sample indicated that this sample mainly consisted of the $Y_1Ba_2Cu_3O_{7-y}$ phase, the $Y_2BaCuO_5$ phase, and the CuO phase. The sample appeared to contain a significant degree of (001) orientation in the $Y_1Ba_2Cu_3O_{7-y}$ phase.

The pellet was subsequently cut into several small bar-shaped pieces of approximately 2 mm×1 mm×1 mm dimensions and placed inside a glass desiccator with an oxygen partial pressure of one atmosphere of oxygen. An oxygenation of the samples in the glass desiccator was carried out by continuously maintaining the samples in the desiccator at a temperature between about 50° C. and 70° C. by using an infrared heating lamp. TGA (thermal gravimetric analysis) measurements on other samples had indicated a weight increase up to 0.2% evidencing oxygenation thereof.

Measurements of the electrical resistance (two-, three-, and four-probe arrangements) for one of five $Y_5Ba_6Cu_{11}O_y$ samples from the desiccator ($O_2$ anneal at 70° C. over a period of one week) resulted in the disappearance of any measurable voltage (less than 20 nanovolts) in the temperature range of 220K to 260K depending upon the bias current used and the direction in which the current flowed. For current flowing in the direction perpendicular to the applied force used in pressing the pellets, the first four-probe resistance measurement showed sharp resistance changes at approximately 90K, 185K, 225K, 235K, and 255K when a dc current of 5 μA was applied. These resistive changes are strong indications that several possible superconducting phases are present in this sample. The resistive behavior of the sample was studied by repeated cooling and warming (thermal cycling) of the sample between 300K and 120K. By the fifth thermal cycling, zero resistance for a dc current of 10 μA (current parallel to applied force during pressing the pellet) is evidenced at a temperature of 255K (±5K). FIG. 1 shows the temperature dependence of the resistance during the eighth thermal cycling. Note, in particular, the resistance drops to zero at 255K. To reduce the effects of any possible thermal emfs, an ac resistance measurement using a 9.3 $\mu A_{peak\text{-}peak}$, 7 millihertz ac current was utilized. The ac voltage disappeared also at 255K (±5K). To determine the effect of the electrical lead arrangement, the four electrical lead arrangement was varied and still showed zero resistance below 255K as long as the two current leads were on opposite sides of the sample. Additional two- and three-lead arrangements for the resistance measurements indicated that the resistive drops in the 240K to 275K temperature range resulted from the sample and not from some unusual equipotential lines due to the four electrical lead arrangement. To ensure the accuracy of the transition temperature determination, resistance measurements were also performed in a mixture of dry ice and acetone as the coolant still maintaining the $O_2$ environment around the sample. This procedure guarantees that the temperature is always above 200K.

Figure 2:
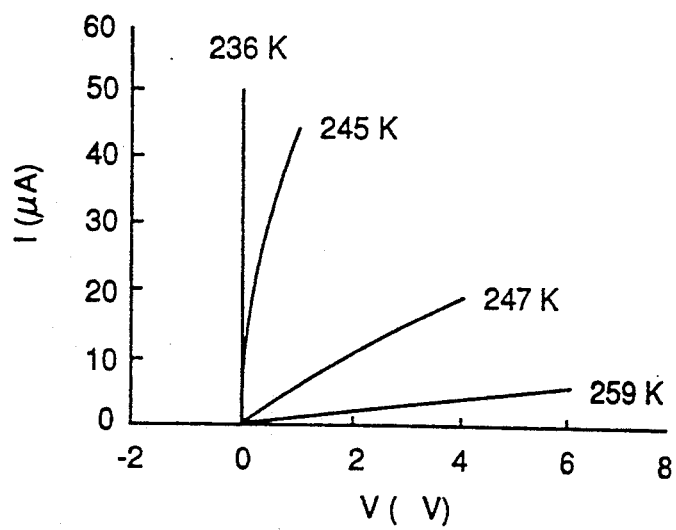
FIG. 2 is a graph which shows the current-voltage (I-V) characteristics for the nominal $Y_5Ba_6Cu_{11}O_y$ material of FIG. 1 in the temperature range below and above the transition temperature for zero-resistance.

The zero-resistance/superconducting state was further verified by performing current-voltage (I-V) characteristics measurements as a function of the temperature with the onset of a zero-voltage current of a few microamperes developing at the transition temperature. As seen in FIG. 2, the I-V characteristics at 259K and above, obey Ohm's Law (a linear relationship between the current and the voltage). But in the transition region, for example at 245K, the I-V curve shows a nonlinear behavior with a small zero-voltage current of 14 μA. At 236K, a sizeable zero-voltage current of 45 μA is clearly observable. This indicates that the sample's resistance was zero within the experimental resolution of 0.44 milliohm (20 nV/45 μA), which is four orders of magnitude smaller than the normal state resistance at 280K. This measurement was done after the twelfth (12th) thermal cycling which resistively indicated that the transition temperature for zero resistance to be 245K. The difference of 10K (~4%$T_c$) in the zero resistance transition temperatures described in FIGS. 1 and 2 is primarily due to the uncertainty in the temperature between the two different thermal cyclings.

Figure 3:
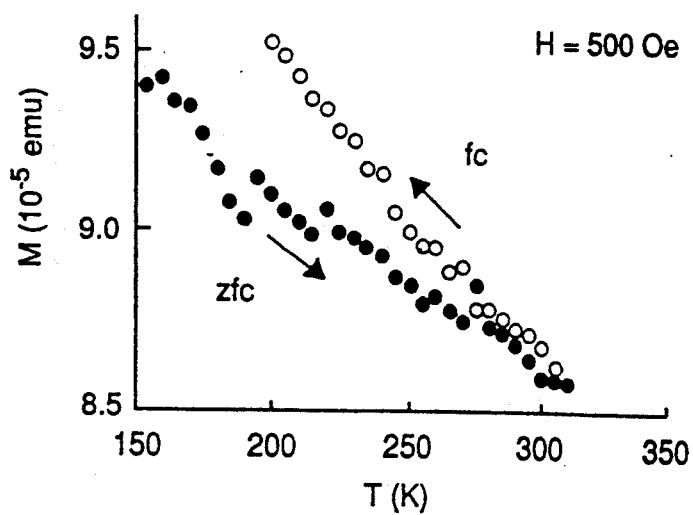
FIG. 3 is a graph which shows the temperature dependence of the zero-field-cooled and field-cooled magnetization for the nominal $Y_5Ba_6Cu_{11}O_y$ material of FIG. 1.

As a function of the magnetic field, changes in the I-V characteristics very near the transition temperature were also observed in fields as small as 2 Oe. The influence of the magnetic field upon the I-V characteristics provides additional support for the superconducting nature of the resistive transition. The stability of a 245K zero-resistance state in this sample was observed to remain for numerous (29) thermal cyclings through the transition temperature (typical thermal cycling between 150–180K to 300K) over a period of 11 days. Magnetization measurements on another sample from the same batch as well as from a smaller section of the sample showing zero resistance were also performed to see if diamagnetic contributions associated with superconductivity (the Meissner effect) could be detected. These magnetization-versus-temperature curves showed diamagnetic-like deviations from their paramagnetic background in the temperature range of 220K to 270K depending upon the applied magnetic field and thermal cycling history. In FIG. 3, a thermal history dependent behavior was evidenced in the magnetization data taken after cooling the sample in zero magnetic field to about 150K, then applying a field of 500 Oe, and measuring the magnetization while warming the sample. Below 270K, this so-called zero-field-cooled magnetization data showed a significant difference from the field-cooled magnetization data which is taken during cooling the sample from 310K to 150K in a field of 500 Oe. (It should be noted that the sample was surrounded by an oxygen atmosphere in these magnetization measurements, too.) The sharp increase in the zero-field-cooled magnetization at 275K and resulting hystereric behavior below 275K provide further evidence for a weak diamagnetic response on top of a stronger paramagnetic background. The strong temperature correlations of these magnetic data to the electrical resistance results provide collaborative evidence for the onset of superconductivity in these samples at temperatures above 200K.

It should be noted that the samples were kept in the heated $O_2$ atmosphere of the desiccator and were removed from this environment only when measurements were to be made at lower temperatures. In addition to the storage of the samples in an oxygen environment, experimental measurements of the electrical resistance and magnetization of the samples below room temperature require the measuring environment to be an oxygen atmosphere in order to observe and to maintain the properties above 200K. It was found that to maintain the properties as described above, it was necessary to maintain the oxygen content of the material. The use of an oxygen atmosphere surrounding the samples during the taking of measurements below room temperature not only appears to prevent the degradation of the properties, but even appeared to improve the properties after two or three thermal cyclings between 150K and 300K.

EXAMPLE 2

In this example, a copper oxide based material was made according to this invention. $Y_5Ba_6Cu_{11}O_y$ samples were first prepared according to a similar procedure as Example 1. Specifically, the procedure was to calcinate the unreacted powders at 925° C. for 24 hours in air. This calcination step was followed by a grinding of the powder and another calcination (heating) at 950° C. for another 24 hours in an $O_2$ atmosphere. The powder was reground, pressed into a pellet at about 50,000 psi, and sintered at 925° C. for 10 hours in $O_2$.

Subsequently, this batch of samples was placed in a high pressure "vessel" filled with (pure) oxygen to a pressure of 130 atmospheres for the oxygenation process. After an oxygenation in the oxygen for 96 hours at 150° C. and cooling back to room temperature over a period of several hours, these samples were removed from the vessel and placed inside an oxygen-filled desiccator under the conditions of that of Example 1.

Qualitative and quantitative results similar to those described above for the sample of Example 1 were observed from electrical resistance and magnetization measurements made on one of the high pressure oxygenated samples of this example. This sample lost its electrical resistance at 265K and has a zero-voltage current exceeding 4 milliamps at 240K. This zero-voltage current was two orders of magnitude greater than that of the samples described in Example 1. Current-voltage measurements were made (current parallel to direction of applied force associated with pressing of pellet) for one of these $Y_5Ba_6Cu_{11}O_y$ samples as a function of the temperature. An ohmic behavior was observed for temperatures above 265K indicating a resistive behavior; however at 265K, a nonlinear behavior was displayed with an approximate 49 μA, zero-voltage current. At 258K, no detectable voltage down to the limit of 10 nanovolts was seen at currents as high as 80 μA (resistance less than $10^{-4}$ ohms). At even lower temperatures, the zero-voltage current was still larger exceeding 4 mA at 240K. A four-probe resistance measurement was taken 5 days later and showed a large resistance drop occurring at 295K and zero resistance at 265K, in agreement with the I-V measurements. Similar magnetization behavior as seen in Example 1 was also observed, namely, diamagnetic-like deviations and hystereric behavior occurring at temperatures correlating to the resistance drops.

EXAMPLE 3

In this example, a copper oxide based material was made according to the invention. Another batch of $Y_5Ba_6Cu_{11}O_y$ samples were made by a similar ceramic technique as Examples 1 and 2. Specifically, the unreacted powders were calcined at 930° C. in $O_2$ for 12 hours. After subsequently grinding the reacted powder, this powder was heated at 950° C. for 12 hours followed by a 10 hour-500° C. heating in $O_2$ to ensure a dark black powder. This reacted powder was reground, pressed into a pellet at about 50,000 psi, sintered at 800° C. for 24 hours in $O_2$, and quenched from 800° C. to room temperature. Small pieces were cut from this pellet and then subjected to an additional sintering at 800° C. for 24 hours in $O_2$, slowly cooled to 270° C., and quenched to room temperature.

This batch of samples was then placed in a high pressure vessel filled with (pure) oxygen to a pressure of 130 atmospheres for the oxygenation process. After an oxygenation in the oxygen for 96 hours at 150° C. and cooling back to room temperature over a period of several hours, these samples were removed from the vessel and placed inside an oxygen-filled desiccator under the conditions of that of Example 1.

Qualitative and quantitative results similar to those described above for the samples of Examples 1 and 2 were observed from electrical resistance and magnetization measurements made of these high pressure oxygenated samples of this example. Current-voltage characteristics measurements were made (current parallel to direction of applied force associated with pressing of the pellet) as a function of temperature in order to determine the transition temperature. A zero-voltage current was clearly observed at 259K in contrast to an ohmic behavior at 305K. Although the transition temperature for zero resistance varied over a 30K temperature range depending on the bias current and thermal history, a zero resistance state above 220K was maintained for several thermal cycles over a seven day period of time. The maximum zero-voltage current exceeded 40 mA at 240K. Similar magnetization behavior as seen in Examples 1 and 2 was also observed, namely, diamagnetic-like deviations and hystereric behavior occurring at temperatures correlating to the resistance drops.

EXAMPLE 4

In this example, a copper oxide based material was made according to this invention. Samples were prepared according to a similar procedure as Example 1. Specifically, this batch of $Y_5Ba_6Cu_{11}O_y$ was produced by calcinating unreacted powders of $Y_2O_3$, $BaCO_3$, and CuO powders at 950° C. for 12 hours in $O_2$ gas. After subsequent grinding the reacted powder, the powder was pressed into a pellet at about 50,000 psi, sintered at 950° C. for 24 hours in $O_2$. The pellet was reground, pressed into another pellet at about 50,000 psi, sintered at 800° C. for another 24 hours in $O_2$, and furnace-cooled to room temperature. Small pieces were cut from this pellet, then subjected to an additional sintering at 800° C. for 27 hours in $O_2$ and cooled to 270° C. before removing from the furnace.

These pieces were then placed in a high pressure vessel filled with (pure) oxygen to a pressure of 130 atmospheres for the oxygenation process. After an oxygenation in the oxygen for 96 hours at 150° C. and cooling back to room temperature over a period of several hours, these samples were removed from the vessel and placed inside an oxygen-filled desiccator under the conditions of that of Example 1.

Qualitative and quantitative results similar to those described above for the sample of Example 3 were observed from electrical resistance measurements made on one of these high-pressured oxygenated samples of this example. Current-voltage characteristics measurements were made (current parallel to direction of applied force associated with pressing of the pellet) as a function of temperature. The transition temperature with a zero-voltage current was determined to be 270K±10K when the sample was measured in an oxygen environment.

When the oxygen environment surrounding the sample was removed (i.e., a vacuum) at room temperature, the sample's normal-state resistance increased and the zero-resistance transition of 270K disappeared, i.e., no zero-voltage current was detectable. This counter example indicates that the higher-$T_c$ phase is related to the oxygenation at low temperatures and is unstable in a non-oxygen environment, i.e., a vacuum or even helium vapor.

EXAMPLE 5

In this example, a copper oxide based material was made according to the invention. First a nominal $Y_1Ba_2Cu_3O_7$ sample was made and subsequently sintered according to the ceramic procedures of Example 1. This sample was cut into a batch of bar shaped samples and then oxygenated according to an embodiment of this invention for four weeks at 50° C. in (pure) oxygen at 1 atmosphere. The x-ray diffraction pattern showed the $Y_1Ba_2Cu_3O_7$ phase and a high degree of (001) orientation. The magnetization measurements made on several samples from the batch resulted in similar magnetic hysteresis and magnetization jumps as observed in the previous examples. For one sample, the hysteresis begins at 265K with magnetization jumps at 235K in the zero-field cooled data and at 180K in the field-cooled data. These data are consistent with superconducting phenomena involving flux jumps and strong flux pinning in Type II superconductors. The temperature dependence of the electrical resistance and I-V characteristics were experimentally indeterminate over the temperature range of 120K to 350K, thus no conclusive data for zero resistance states is available on these samples. The strong qualitative similarity in the magnetization data of the $Y_1Ba_2Cu_3O_{7-y}$ composition samples to the $Y_5Ba_6Cu_{11}O_y$ composition samples of Examples 1 and 2 (and the latter's temperature correlations in the resistance and magnetization data) indicate superconductive behavior at temperatures above 200K in these $Y_1Ba_2Cu_3O_7$ composition samples.

EXAMPLE 6

In this example, samples of copper oxide based materials are made according to the invention. First, a batch of samples of composition $Y_1Ba_2Cu_3O_7$ are synthesized and sintered according to the ceramic procedures of Example 1. Then some of the samples are oxygenated at 70° C. at 1 atm of $O_2$ for one week. Others of the samples are oxygenated at 150° C. at 100 atm of $O_2$ for three days. The samples display similar electrical resistance and magnetization characteristics as those of Example 1.

In view of this disclosure, many modifications of this invention will be apparent to those skilled in the art. It is intended that all such modifications which fall within the true scope of the invention will be included within the terms of the appended claims.

We claim:

1. A method for making a multiphase copper oxide based material of $Y_5Ba_6Cu_{11}$ oxide containing a phase having a zero resistance transition temperature above about 200K, said method comprising:
   forming a copper oxide based material precursor consisting essentially of Y, Ba, Cu, and O, which precursor can be oxygenated to yield said multiphase copper oxide based material; and
   subjecting said precursor to a high temperature heating process at a temperature greater than 900° C. for at least 10 hours;
   subjecting said precursor to a low temperature oxygenation process in an atmosphere comprising at least about 20% oxygen by volume at a temperature less than about 200° C. for at least 72 hours to form said multiphase copper oxide based material.

2. The method according to claim 1, wherein said precursor is subjected to said oxygenation process in an atmosphere comprising more than about 95% oxygen by volume.

3. The method according to claim 2, wherein said oxygenation temperature is between about −100° C. and about 200° C.

4. The method according to claim 1, wherein said oxygenation temperature is between about −100° C. and about 200° C.

5. The method according to claim 1, wherein said oxygenation time is greater than about 5 days and said atmosphere is at a pressure of at least about 1 atmosphere.

6. The method according to claim 1, wherein said atmosphere is at a pressure of greater than about 100 atmospheres.

7. The method according to claim 6, wherein said oxygenation temperature is between about 120° and 170° C.

8. A method for making a multiphase copper oxide based material of $Y_5Ba_6Cu_{11}$ oxide containing a phase having a zero resistance transition temperature above about 200K, said method comprising:
   forming a multiphase copper oxide based material precursor consisting essentially of Y, Ba, Cu, and O, which precursor can be oxygenated to yield said multiphase copper oxide based material;
   subjecting said precursor to a high temperature heating process at a temperature greater than 900° C. for at least 10 hours;
   subjecting said precursor to a low temperature oxygenation process in an atmosphere comprising at least about 20% oxygen by volume at a temperature less than about 200° C. for at least 72 hours to form said multiphase copper oxide based material; and
   maintaining the oxygen content by providing an oxygen atmosphere comprising at least 50% by volume oxygen surrounding said multiphase copper oxide based material, while keeping said multiphase copper oxide based material at a temperature less than about 200° C.

* * * * *